(12) United States Patent  
Cok et al.

(10) Patent No.: US 7,602,118 B2
(45) Date of Patent: Oct. 13, 2009

(54) OLED DEVICE HAVING IMPROVED LIGHT OUTPUT

(75) Inventors: Ronald S. Cok, Rochester, NY (US); Donald R. Preuss, Rochester, NY (US); Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 498 days.

(21) Appl. No.: 11/065,082

(22) Filed: Feb. 24, 2005

(65) Prior Publication Data

US 2006/0186802 A1    Aug. 24, 2006

(51) Int. Cl.
*H05B 33/04* (2006.01)
*H05B 33/10* (2006.01)
(52) U.S. Cl. ..................... 313/506; 313/504
(58) Field of Classification Search ......... 313/500–512, 313/489; 428/690
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,834,893 A | 11/1998 | Bulovic et al. | |
| 5,955,837 A | 9/1999 | Horikx et al. | |
| 6,091,195 A | 7/2000 | Forrest et al. | |
| 6,144,429 A * | 11/2000 | Nakai et al. ............ | 349/113 |
| 6,472,804 B2 * | 10/2002 | Mueller et al. .......... | 313/326 |
| 6,777,871 B2 | 8/2004 | Duggal et al. | |
| 6,787,796 B2 | 9/2004 | Do et al. | |
| 7,109,652 B2 * | 9/2006 | Tsai et al. .............. | 313/506 |
| 2001/0026124 A1 | 10/2001 | Liu et al. | |
| 2002/0011783 A1 * | 1/2002 | Hosokawa ............... | 313/504 |

(Continued)

FOREIGN PATENT DOCUMENTS

EP    1 100 129    5/2001

(Continued)

OTHER PUBLICATIONS

"Light Scattering and Other Optical Methods," Langley, et al., in Methods of the Physics of Porous Media, edited Po-zen Wong, Academic Press, 1999, 263-297.*

(Continued)

*Primary Examiner*—Nimeshkumar D. Patel
*Assistant Examiner*—Anne M Hines
(74) *Attorney, Agent, or Firm*—Andrew J. Anderson; Raymond L. Owens

(57) ABSTRACT

An organic light-emitting diode (OLED) device, comprising: a substrate; an OLED comprising first and second electrodes and one or more layers of organic light-emitting material formed between the electrodes, wherein at least one electrode comprises a transparent electrode, the transparent electrode and layer(s) of organic light-emitting material having a first refractive index range; and an encapsulating cover; wherein at least one of the substrate or cover comprises a transparent substrate or cover having a second refractive index and through which light from the OLED is emitted; and further comprising a light scattering layer located between the substrate and cover, and a transparent low-index element having a third refractive index lower than each of the first refractive index range and second refractive index and located between the scattering layer and the transparent substrate or cover.

26 Claims, 7 Drawing Sheets

U.S. PATENT DOCUMENTS

| | | | |
|---|---|---|---|
| 2002/0061418 A1* | 5/2002 | Imanishi | 428/690 |
| 2003/0071569 A1* | 4/2003 | Chung et al. | 313/512 |
| 2003/0146453 A1* | 8/2003 | Beck et al. | 257/200 |
| 2003/0203551 A1* | 10/2003 | Cok et al. | 438/200 |
| 2003/0209972 A1* | 11/2003 | Holmes et al. | 313/504 |
| 2004/0031977 A1* | 2/2004 | Brown et al. | 257/222 |
| 2004/0061136 A1 | 4/2004 | Tyan et al. | |
| 2004/0119400 A1* | 6/2004 | Takahashi et al. | 313/504 |
| 2004/0217702 A1 | 11/2004 | Garner et al. | |
| 2005/0018431 A1 | 1/2005 | Shiang | |
| 2005/0142379 A1* | 6/2005 | Juni et al. | 428/690 |

FOREIGN PATENT DOCUMENTS

| | | |
|---|---|---|
| EP | 1 406 474 | 4/2004 |
| WO | 02/37568 | 5/2002 |
| WO | 02/67580 | 5/2002 |
| WO | 02080626 | * 10/2002 |
| WO | WO 03/001490 | 1/2003 |

OTHER PUBLICATIONS

Negative refraction index article: http://physicsworld.com/cws/article/print/17398.*

C. W. Tang et al; "Organic Electroluminescent Diodes"; Applied Physics Letters; vol. 51; No. 12; Sep. 21, 1987; pp. 913-915.

C. W. Tang et al; "Electroluminescence Of Doped Organic Thin Films"; Journal of Applied Physics; vol. 65; No. 9; May 1, 1989; pp. 3610-3616.

A. N. Safonov et al; "Modification Of Polymer Light Emission By Lateral Microstructure"; Synthetic Metals; 116; 2001; pp.145-148.

John M. Lupton et al; "Bragg Scattering From Periodically Microstructured Light Emitting Diodes"; Applied Physics Letters; vol. 77; No. 21; Nov. 20, 2000; pp. 3340-3342.

Tetsuo Tsutsui et al; "Sharply Directed Emission In Organic Electroluminescent Diodes With An Optical-Microcavity Structure"; Applied Physics Letters; vol. 65; No. 15; Oct. 10, 1994; pp. 1868-1870.

* cited by examiner

OLED DEVICE HAVING IMPROVED LIGHT OUTPUT

FIELD OF THE INVENTION

The present invention relates to organic light-emitting diode (OLED) devices, and more particularly, to OLED device structures for improving light output.

BACKGROUND OF THE INVENTION

Organic light-emitting diodes (OLEDs) are a promising technology for flat-panel displays and area illumination lamps. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 13, a prior-art bottom-emitting OLED has a transparent substrate 10, a transparent first electrode 12, one or more layers 14 of organic material, one of which is light-emitting, a reflective second electrode 16, a gap 19 and an encapsulating cover 20. The encapsulating cover 20 may be opaque and may be coated directly over the second electrode 16 so that no gap 19 exists. When a gap 19 does exist, it may be filled with polymer or desiccants to add rigidity and reduce water vapor permeation into the device. Light emitted from one of the organic material layers 14 can be emitted directly out of the device, through the substrate 10, as illustrated with light ray 1. Light may also be emitted and internally guided in the substrate 10 and organic layers 14, as illustrated with light ray 2. Alternatively, light may be emitted and internally guided in the layers 14 of organic material, as illustrated with light ray 3. Light rays 4 emitted toward the reflective second electrode 16 are reflected by the reflective second electrode 16 toward the substrate 10 and then follow one of the light ray paths 1, 2, or 3.

Referring to FIG. 14, a top-emitting OLED device as proposed in the prior art is illustrated having a substrate 10 (either reflective, transparent, or opaque), a reflective first electrode 16, one or more layers 14 of organic material, one of which is light-emitting, a transparent second electrode 12, a gap 19 and an encapsulating cover 20. The encapsulating cover 20 is transparent and may be coated directly over the transparent electrode 12 so that no gap 19 exists. It has been proposed to fill the gap with polymeric or desiccating material. Such polymers and desiccants typically will have indices of refraction greater than or equal to that of the substrate 10 or encapsulating cover 20, and it is generally proposed to employ materials having indices of refraction matched to that of the encapsulating cover to reduce interlayer reflections. Light emitted from one of the organic material layers 14 can be emitted directly out of the device, through the encapsulating cover 20, as illustrated with light ray. 1. Light may also be emitted and internally guided in the encapsulating cover 20 and organic layers 14, as illustrated with light ray 2. Additionally, light may be emitted and internally guided in the layers 14 of organic material, as illustrated with light ray 3. Light rays 4 emitted toward the reflective first electrode 12 are reflected by the reflective first electrode 12 toward the substrate 10 and follow one of the light ray paths 1, 2, or 3. In some prior-art embodiments, the first electrode 12 may be opaque and/or light absorbing.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective.

Reflective structures surrounding a light-emitting area or pixel are referenced in U.S. Pat. No. 5,834,893 issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas. However, considerable light is still lost through absorption of the light as it travels laterally through the layers parallel to the substrate within a single pixel or light emitting area.

Scattering techniques are also known. Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

However, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 15, a prior-art pixellated bottom-emitting OLED device may include a plurality of independently controlled pixels 30, 32, 34, 36, and 38 and a scattering layer 22 located between the transparent first electrode 12 and the substrate 10. A light ray 5 emitted from the light-emitting layer may be scattered multiple times by scattering layer 22, while traveling through the substrate 10, organic layer(s) 14, and transparent first electrode 12 before it is emitted from the device. When the light ray 5 is finally emitted from the device, the light ray 5 has traveled a considerable distance through the various device layers from the original pixel 30 location where it originated to a remote pixel 38 where it is emitted, thus reducing sharpness. Most of the lateral travel occurs in the substrate 10, because that is by far the thickest layer in the package. Also, the amount of light emitted is reduced due to absorption of light in the various layers. If the light scattering layer is alternatively placed adjacent to a transparent encapsulating cover of a top-emitting device as illustrated in FIG. 16, the light may similarly travel a significant distance in the encapsulating cover 20 before being emitted.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3). Moreover, if applied to display devices, this structure will decrease the perceived sharpness of the display. Referring to FIG. 17, the sharpness of an active matrix OLED device employing a light-scattering layer coated on the substrate is illustrated. The average MTF (sharpness) of the device (in both horizontal and vertical directions) is plotted for an OLED device with the light-scattering layer and without the light scattering layer. As is shown, the device with the light-scattering layer is much less sharp than the device without the light scattering layer, although more light was extracted (not shown) from the OLED device with the light-scattering layer.

U.S. Patent Application Publication No. 2004/0061136 entitled "Organic light emitting device having enhanced light extraction efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

There is a need therefore for an improved organic light-emitting diode device structure that avoids the problems noted above and improves the efficiency and sharpness of the device.

SUMMARY OF THE INVENTION

In accordance with one embodiment, the invention is directed towards an organic light-emitting diode (OLED) device, comprising: a substrate; an OLED comprising first and second electrodes and one or more layers of organic light-emitting material formed between the electrodes, wherein at least one electrode comprises a transparent electrode, the transparent electrode and layer(s) of organic light-emitting material having a first refractive index range; and an encapsulating cover; wherein at least one of the substrate or cover comprises a transparent substrate or cover having a second refractive index and through which light from the OLED is emitted; and further comprising a light scattering layer located between the substrate and cover, and a transparent low-index element having a third refractive index lower than each of the first refractive index range and second refractive index and located between the scattering layer and the transparent substrate or cover.

Advantages

The present invention:has the advantage that it increases the light output from, and improves the sharpness of, an OLED device.

It will be understood that the figures are not to scale since the individual layers are too thin and the thickness differences of various layers too great to permit depiction to scale.

DETAILED DESCRIPTION OF THE INVENTION

Figure 1:
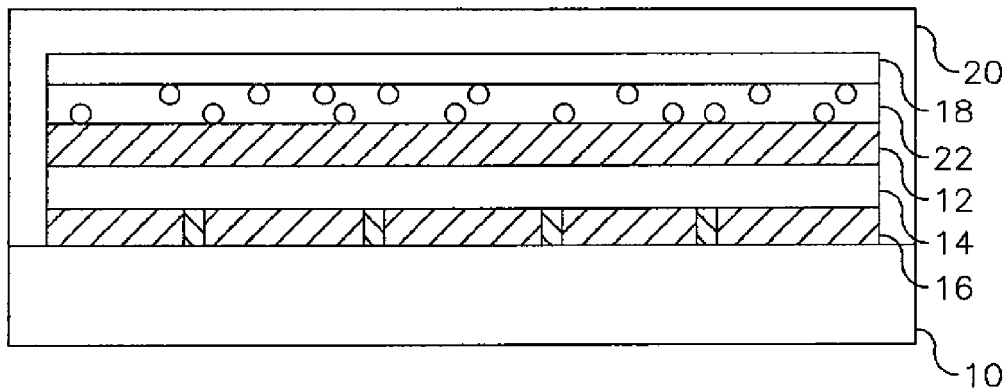
FIG. 1 illustrates a cross section of a top-emitter OLED device having a scattering layer according to one embodiment of the present invention.

Referring to FIG. 1, in accordance with one embodiment, a top-emitting organic light-emitting diode. (OLED) device comprises a substrate 10; an OLED comprising a first reflective electrode 16 and a second transparent electrode 12, one or more layers 14 of organic light-emitting material formed between the electrodes 12 and 16, and an encapsulating transparent cover 20 through which light from the OLED is emitted. Either one of the first or second electrodes 12 or 16 may be pixellated to form distinct light emitting areas. The transparent electrode 12 and layer(s) 14 of organic light-emitting material have a first refractive index range, and the transparent cover 20 has a second refractive index. A light scattering layer 22 is located between the substrate and cover, in this embodiment between the transparent electrode 12 and the cover 20. As employed herein, a light scattering layer is an optical layer that tends to randomly redirect any light that impinges on the layer from any direction. Transparent low-index element 18 having a third refractive index lower than each of the first refractive index range and second refractive index is located between the scattering layer 22 and the transparent cover 20. As used herein, a transparent electrode is one that passes some light and includes electrodes that are semi-transparent, partially reflective, or partially absorptive. In an alternative embodiment of the present invention, bottom electrode 16 may also be transparent, so that light may be emitted from both sides of the device. In such alternative embodiment, a second transparent low-index element may be employed between the scattering layer and the substrate, e.g. adjacent to the substrate.

Figure 2:
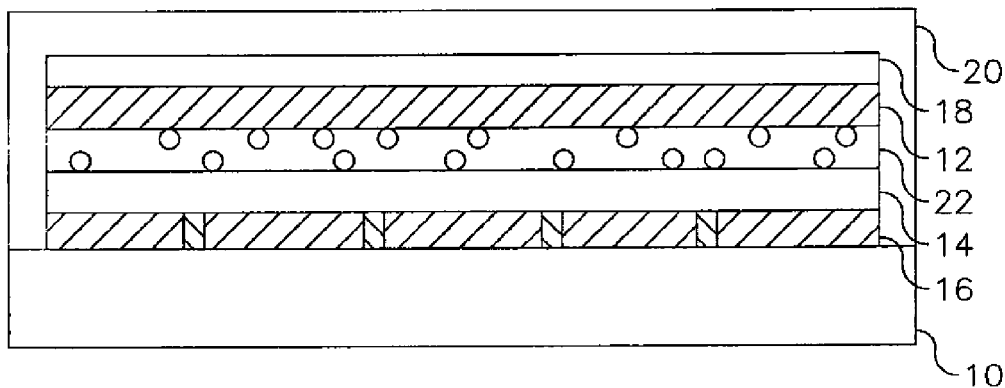
FIG. 2 illustrates a cross section of a top-emitter OLED device having a scattering layer according to an alternative embodiment of the present invention.
Figure 3:
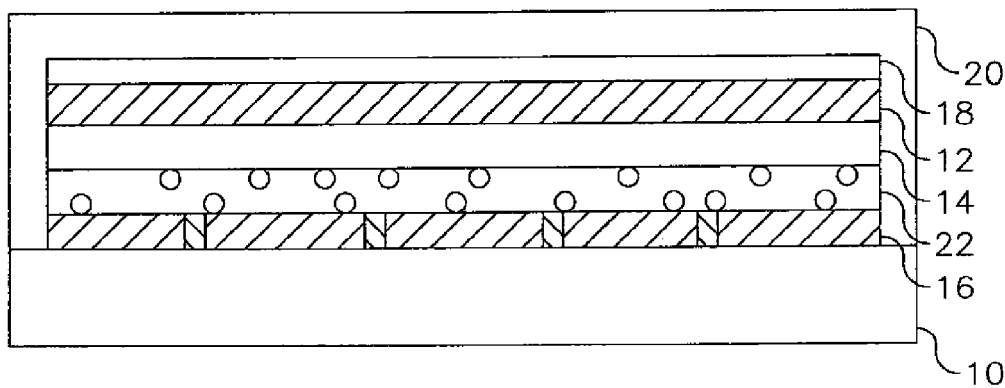
FIG. 3 illustrates a cross section of a top-emitter OLED device having a scattering layer according to another embodiment of the present invention.
Figure 4:
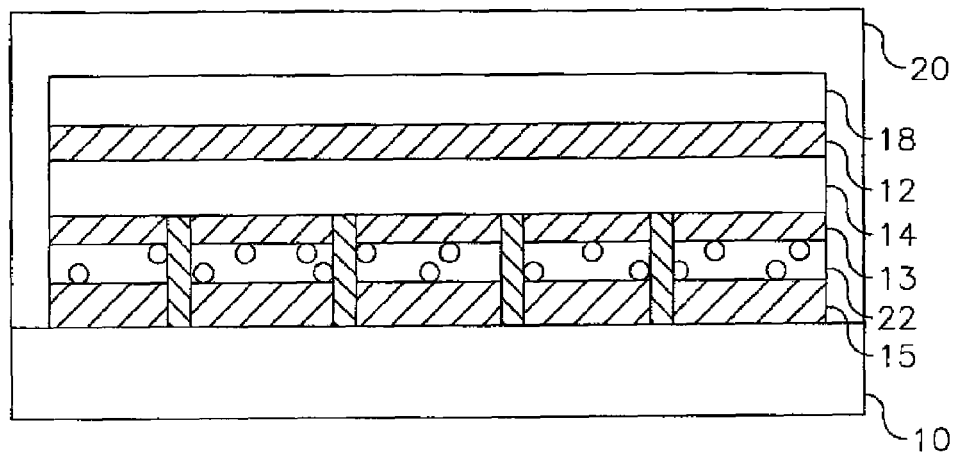
FIG. 4 illustrates a cross section of a top-emitter OLED device having a scattering layer according to another embodiment of the present invention.

According to the present invention, the transparent low-index element 18 may be located anywhere in the OLED device between scattering layer 22 and the encapsulating cover 20 (for a top-emitter) or between scattering layer 22 and the substrate 20 (for a bottom-emitter). Hence, in various embodiments the scattering layer 22 may be adjacent to either electrode 12 or 16 opposite the organic layers 14 as illustrated in FIG. 1 for a top-emitter and in FIG. 5 for a bottom emitter, or between the electrodes 12 and 16 and on either side of the organic layers 14 for a top-emitter, as illustrated in FIGS. 2 and 3. In yet another embodiment, the reflective electrode 16 may comprise multiple layers, for example a transparent, electrically conductive layer 13 and a reflective layer 15. As shown in FIG. 4, the scattering layer may be located between the reflective layer 15 and the transparent, electrically conductive layer 13. The reflective layer 15 may also be conductive, as may the scattering layer 22. In this case, it is preferred that the transparent, conducting layer 13 have a refractive index in the first refractive index range.

Figure 5:
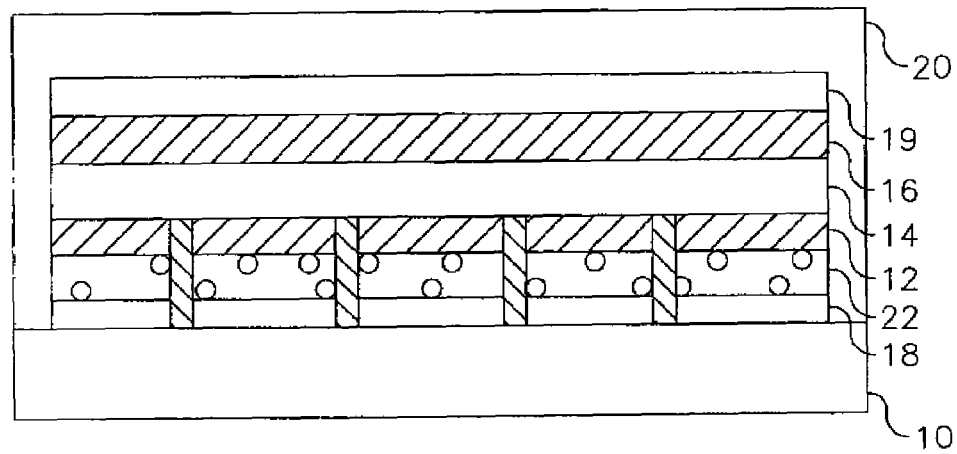
FIG. 5 illustrates a cross section of a bottom-emitter OLED device having a scattering layer according to yet another embodiment of the present invention.

Referring to FIG. 5, in another embodiment of the present invention, the organic light-emitting diode (OLED) device is constructed as a bottom-emitting device comprising a substrate 10; an OLED having a first transparent electrode 12 formed over the substrate 10, one or more layers 14 of organic light-emitting material formed over the first transparent electrode 12, and a reflective second electrode 16 formed over the layer(s) 14 of organic light-emitting material to define a light-emitting area; the first transparent electrode 12 and layer(s) 14 of organic light-emitting material having a first refractive index range; a scattering layer 22 located over the substrate 10. The substrate 10 has a second refractive index. Transparent low-index element 18 located between the scattering layer 22 and the substrate 10 has a third refractive index lower than the first refractive index range and the second refractive index. The configurations of FIGS. 1, 2, 3, and 4 may also be employed in a bottom-emitter configuration by locating the scattering layer 22 in the corresponding positions with the transparent low-index element 18 located as illustrated in FIG. 5. In these cases, the transparent low-index element 18 reduces the propagation of scattered light in the substrate 10 and reduces the loss of image sharpness as a result of this propagation.

In preferred embodiments, the encapsulating cover 20 and substrate 10 may comprise glass or plastic with typical refractive indices of between 1.4 and 1.6. The transparent low-index element 18 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrode 16 is preferably made of metal (for example aluminum, silver, or magnesium) or metal alloys. Transparent electrode 12 is preferably made of transparent conductive materials, for example indium tin oxide (ITO) or other metal oxides. The organic material layers 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 12 and 14 in the OLED have a refractive index range of 1.6 to 2.1. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the OLED emitter.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the first refractive index range. This is to insure that all of the light trapped in the organic layers 14 and transparent electrode 12 can experience the direction altering effects of scattering layer 22. If scattering layer 22 has a thickness less than one-tenth part of the wavelength of the emitted light, then the materials in the scattering layer need not have such a preference for their refractive indices.

Figure 6:
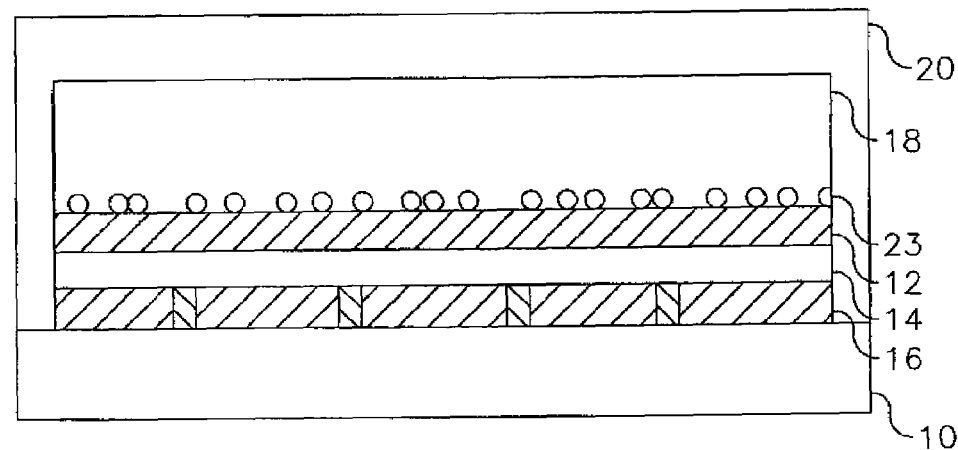
FIG. 6 illustrates a cross section of a top-emitter OLED device having scattering particles according to another embodiment of the present invention.
Figure 7:
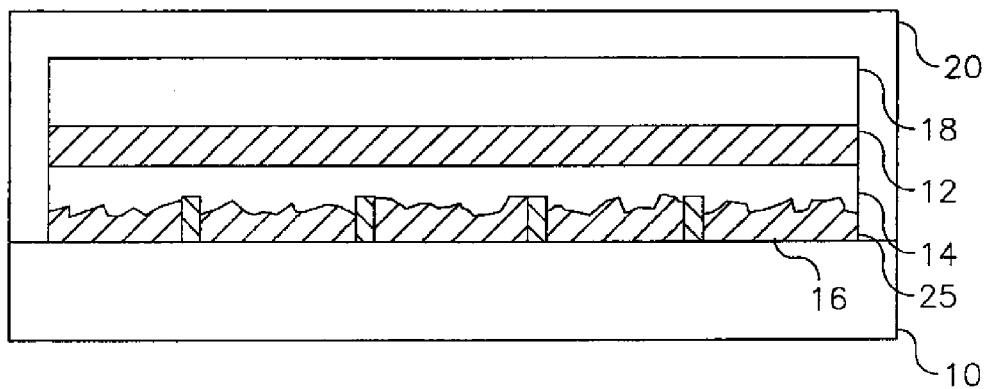
FIG. 7 illustrates a cross section of a top-emitter OLED device having a reflective scattering surface according to another embodiment of the present invention.
Figure 8:
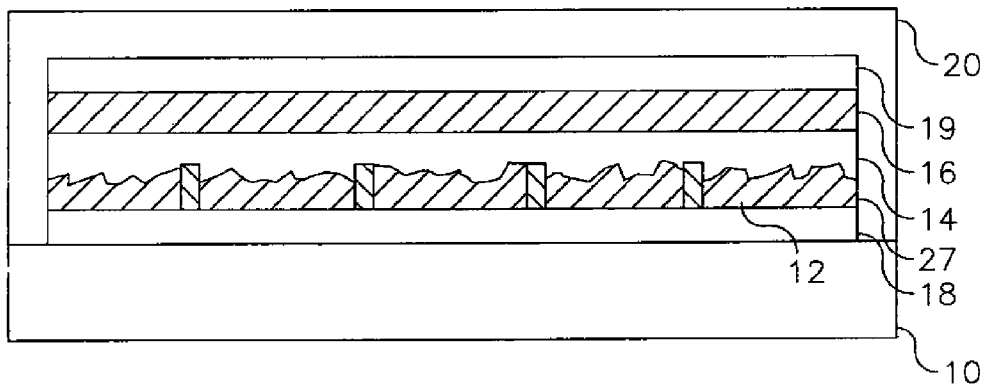
FIG. 8 illustrates a cross section of a bottom-emitter OLED device having a scattering surface according to another embodiment of the present invention.

In an alternative embodiment shown in FIG. 6, scattering layer 22 may comprise particles 23 deposited on another layer, e.g., particles of titanium dioxide may be coated over transparent electrode 12 to scatter light. Preferably, such particles are at least 100 nm in diameter to optimize the scattering of visible light. In a further top-emitter alternative shown in FIG. 7, scattering layer 22 may comprise a rough, diffusely reflecting surface 25 of electrode 16 itself or in a bottom-emitter alternative shown in FIG. 8 scattering layer 22 may comprise a rough, diffusely refracting surface 27 of transparent electrode 12 itself. In an alternative bottom-emitter configuration, the scattering layer may be a rough, diffusely reflecting surface of the reflecting electrode 16, or a rough, diffusely refracting surface of the transparent electrode 12, of FIG. 5.

The scattering layer 22 is typically adjacent to and in contact with, or close to, an electrode to defeat total internal reflection in the organic layers 14 and transparent electrode 12. However, if the scattering layer 22 is between the electrodes 12 and 16, it may not be necessary for the scattering layer to be in contact with an electrode 12 or 16 so long as it does not unduly disturb the generation of light in the OLED layers 14. According to an embodiment of the present invention, light emitted from the organic layers 14 can waveguide along the organic layers 14 and electrodes 12 combined, since the organic layers 14 have a refractive index lower than that of the transparent electrode 12 and electrode 16 is reflective. The scattering layer 22 or surface 25, 27 disrupts the total internal reflection of light in the combined layers 14 and 12 and redirects some portion of the light out of the combined layers 14 and 12.

It is important to note that a scattering layer will also scatter light that would have been emitted out of the device back into the layers 14, exactly the opposite of the desired effect. Hence, the use of optically transparent layers that are as thin as possible is desired in order to extract light from the device with as few reflections as possible.

Figure 9:
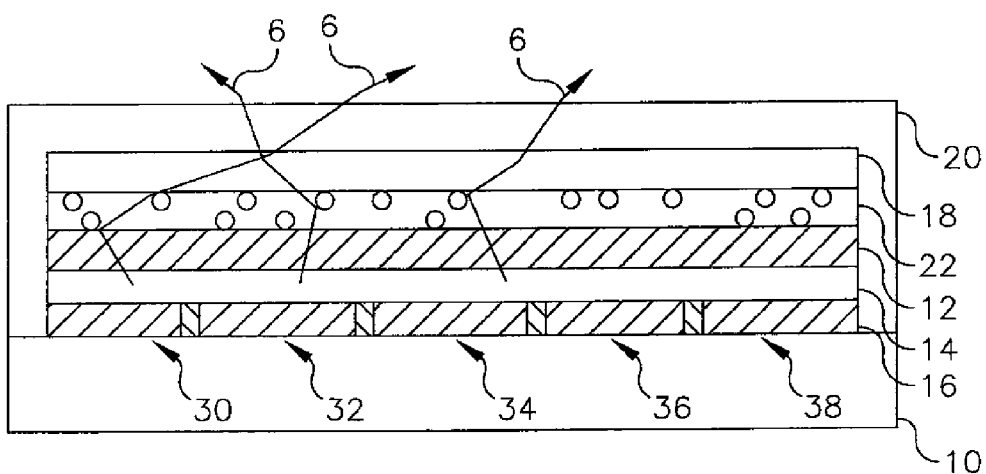
FIG. 9 illustrates a cross section of a top-emitter OLED device having a refractive scattering layer showing light paths according to an embodiment of the present invention.
Figure 15:
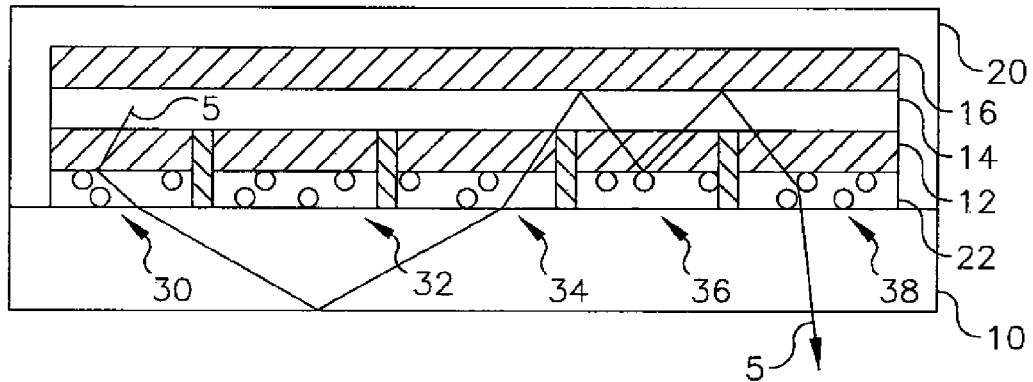
FIG. 15 illustrates a cross section of a prior-art bottom-emitter OLED device having a scattering layer.
Figure 16:
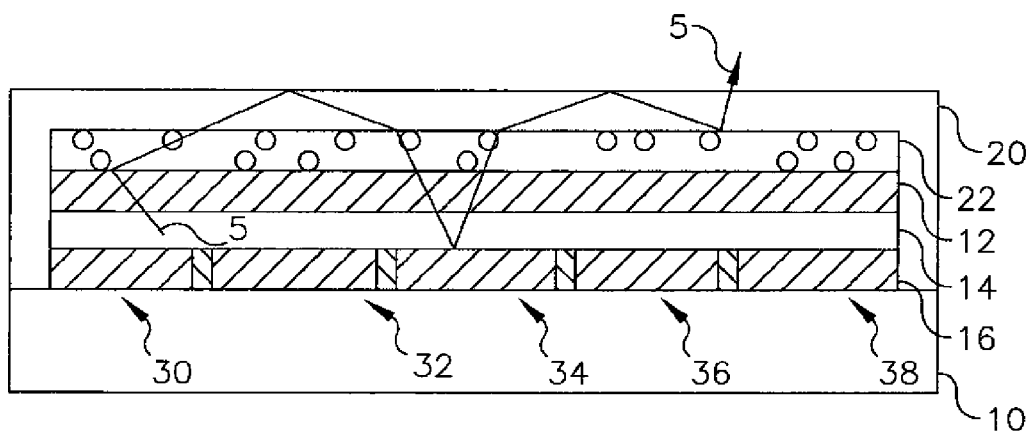
FIG. 16 illustrates a cross section of a top-emitter OLED device having a scattering layer.
Figure 17:
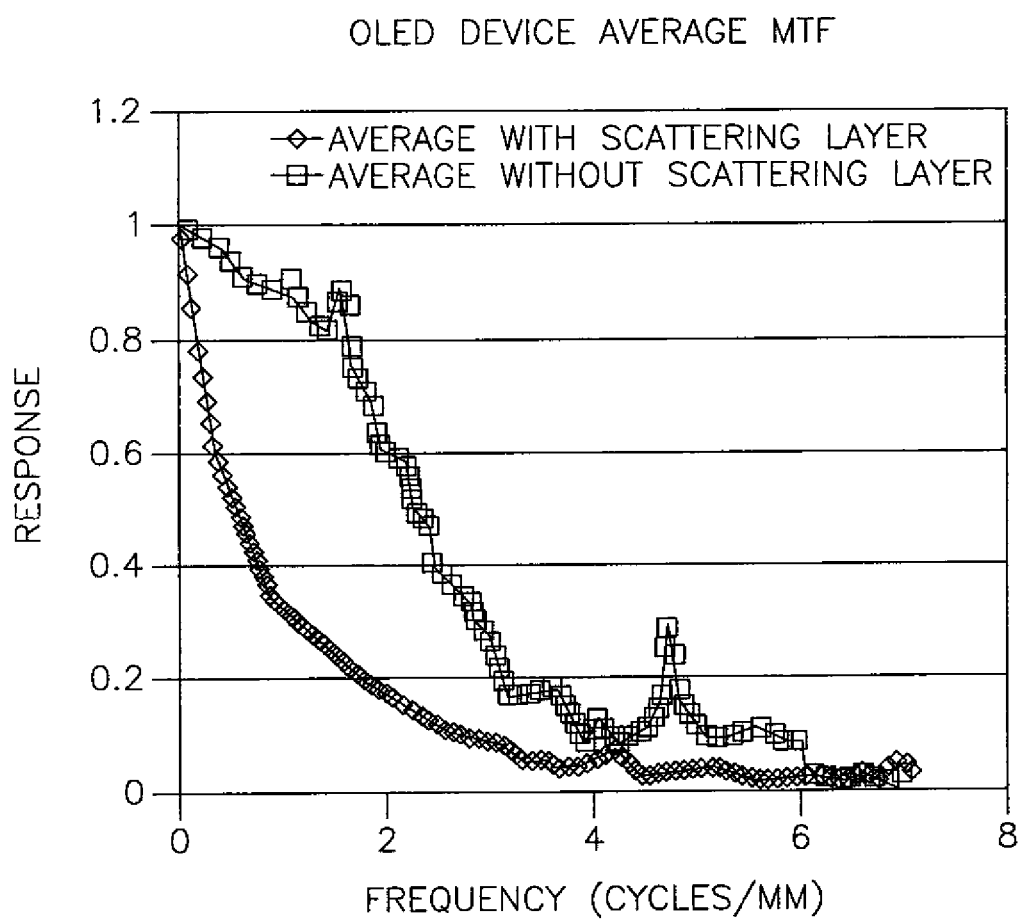
FIG. 17 is a graph demonstrating the loss in sharpness due to a scattering layer in a prior-art active-matrix bottom-emitting OLED device.

The present invention is preferred over the prior art because the number of interlayer reflections that the light encounters and the distance that scattered light travels in the encapsulating cover 20 (for a top-emitter) or substrate 10 (for a bottom-emitter) are reduced. Referring to FIG. 9, after light rays 6 are scattered into an angle that allows it to escape from the organic layers 14 and transparent second electrode 12, it enters the transparent low-index element 18 (for example, air) that has a lower index of refraction than both the transparent electrode 12 and the encapsulating cover 20 or substrate 10. Therefore, when the scattered light encounters the encapsulating cover 20 or substrate 10, it will pass through the encapsulating cover 20 (or substrate 10 for a bottom-emitter configuration) and be re-emitted on the other side, since light passing from a low-index medium into a higher-index medium cannot experience total internal reflection. Hence, the light will not experience the losses due to repeated transmission through the encapsulating cover 20 or substrate 10, or demonstrate the lack of sharpness that results from light being emitted from the organic layers 14 at one point and emitted from the encapsulating cover 20 or substrate 10 at a distant point, as illustrated in FIGS. 15 and 16. To facilitate this effect, the transparent low-index element 18 should not itself scatter light, and should be as transparent as possible. The transparent low-index element 18 is preferably at least one micron thick to ensure that emitted light properly propagates through the transparent low-index element and is transmitted through the encapsulating cover 20.

Figure 12:
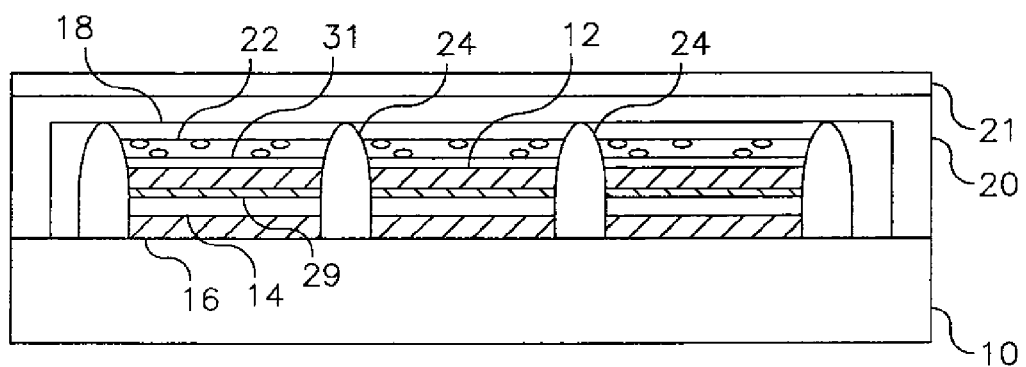
FIG. 12 illustrates a cross section of a top-emitter OLED device having a scattering layer, a protection layer, and a short-reduction layer together with raised areas according to an alternative embodiment of the present invention.
Figure 13:
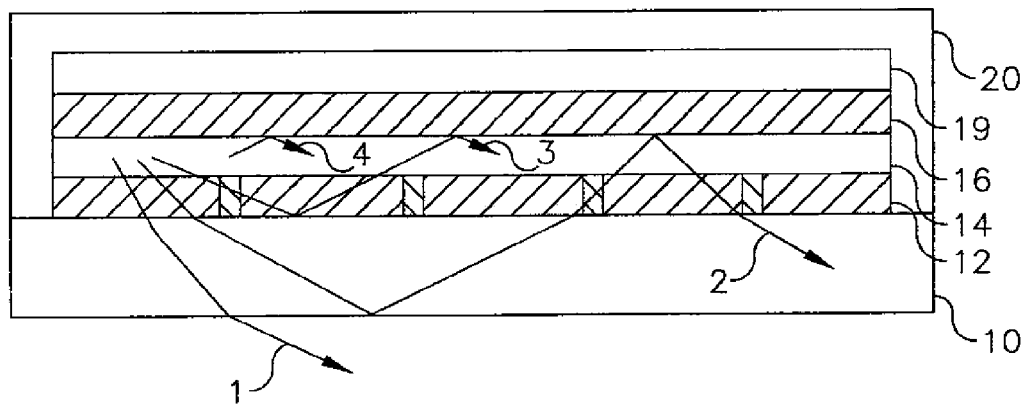
FIG. 13 illustrates a cross section of a prior-art bottom-emitter OLED device.
Figure 14:
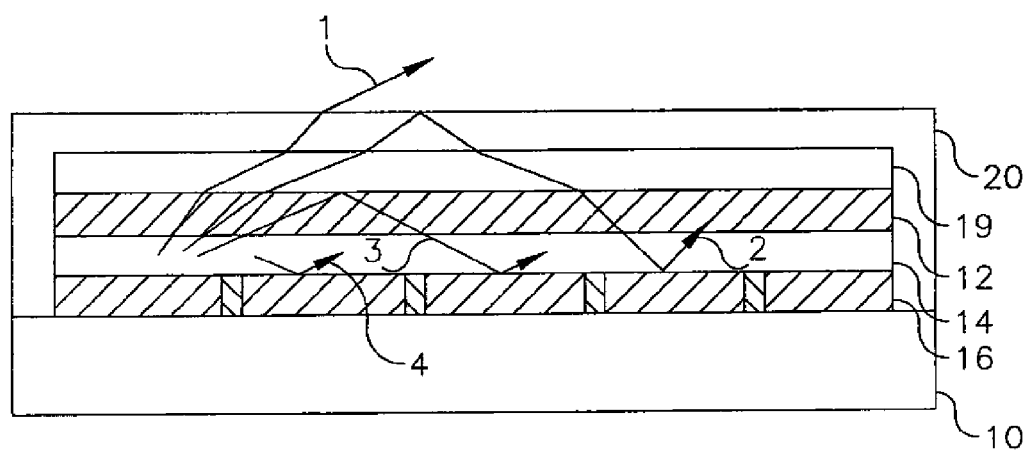
FIG. 14 illustrates a cross section of a prior-art top-emitter OLED device.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the encapsulating cover 20, for top emitters, and on both sides of the transparent substrate 10, for bottom emitters. Referring to FIG. 12, an anti-reflective layer 21 is illustrated on the outside of transparent cover 20.

Figure 10:
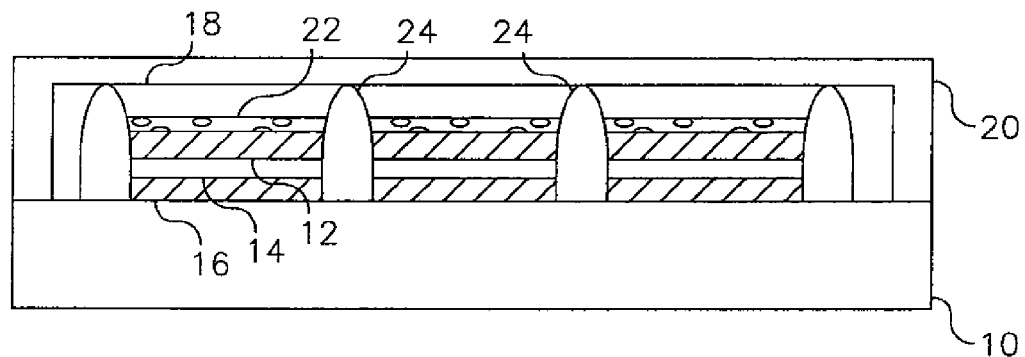
FIG. 10 illustrates a cross section of a top-emitter OLED device having a scattering layer and raised areas according to an embodiment of the present invention.

The transparent low-index element 18 is useful for extracting additional light from the OLED device. However, in practice, if a void or gap (filled with a gas or is a vacuum) is employed in a top-emitter configuration as a transparent low-index element 18, the mechanical stability of the device may be affected, particularly for large devices. For example, if the OLED device is inadvertently curved or bent, or the encapsulating cover 20 or substrate 10 are deformed, the encapsulating cover 20 may come in contact with the transparent electrode 12 and destroy it. Hence, some means of preventing the encapsulating cover 20 from contacting the transparent electrode 12 in a top-emitter OLED device may be useful. Referring to FIG. 10, according to another top-emitter embodiment of the present invention having a scattering layer 22 located over the transparent electrode 12, the organic material layer 14 and the electrodes 12 and 16 may be surrounded, partially or entirely, by a raised area 24. The raised area 24 can be in contact with the encapsulating cover 20. By providing a mechanical contact between the encapsulating cover 20 and the substrate 10 within or around the light-emitting area of the device, the OLED device can be made more rigid and a gap or void serving as transparent low-index element 18 created. Alternatively, if flexible substrates 10 and covers 20 are employed, the raised areas 24 can prevent the encapsulating cover 20 from touching the OLED material layer(s) 14 and electrode 12. Such raised areas may be made from patterned insulative materials employed in photo-lithographic processes for thin-film transistors construction in active-matrix devices. The scattering layer 22 may, or may not, be coated over the raised areas 24.

Figure 11:
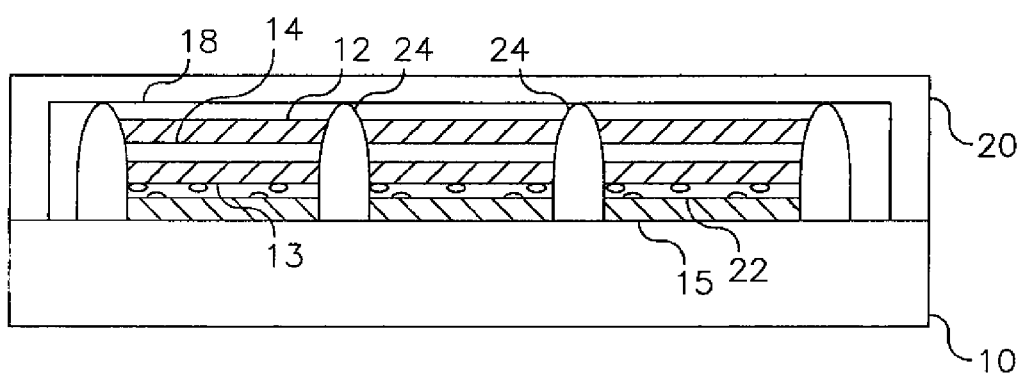
FIG. 11 illustrates a cross section of a top-emitter OLED device having a scattering layer and raised areas according to an alternative embodiment of the present invention.

Referring to FIG. 11, another top-emitter embodiment of the present invention having a multi-layer anode with a scattering layer 22 between the reflective 15 and transparent 13 layers is illustrated. Various embodiments of the invention, including the embodiments of FIGS. 10 and 11, have the advantage that they may be readily manufactured by coating scattering particles, such as titanium dioxide, on inorganic layers without disturbing the organic layers 14, therefore enabling a higher-yield manufacturing process. For example, spin coating may be employed. Alternatively, in the embodiment of FIG. 11, photolithographic processes may be employed to create :scattering structures in the layer 22.

The raised area 24 may be provided with reflective edges to assist with light emission for the light that is emitted toward the edges of each light-emitting area. Alternatively, the raised area 24 may be opaque or light absorbing. Preferably, the sides of the raised areas 24 are reflective while the tops may be black and light absorbing. A light-absorbing surface or coating will absorb ambient light incident on the OLED device, thereby improving the contrast of the device. Reflective coatings may be applied by evaporating thin metal layers. Light absorbing materials may employ, for example, color filters material known in the art. Raised areas within an OLED device are also known in the art and are found, for example in Kodak OLED products such as the ALE251, to protect thin-film transistors and conductive contacts. Construction and deposition techniques are known in the art. A useful height for the raised area above the surface of the OLED is one micron or greater. An adhesive may be employed on the encapsulating cover 20 or raised areas 24 to affix the encapsulating cover 20 to the raised areas 24 to provide additional mechanical strength.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the OLED as quickly as possible so as to reduce the opportunities for re-absorption by the various layers of the OLED device. If the scattering layer 22 is to be located between the organic layers 14 and the transparent low-index element 18, or between the organic layers 14 and a reflective electrode 16, then the total diffuse transmittance of the same layer coated on a glass support should be high (preferably greater than 80%). In other embodiments, where the scattering layer 22 is itself desired to be reflective, then the total diffuse reflectance of the same layer coated on a glass support should be high (preferably greater than 80%). In all cases, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x(x>1)$, $SiN_x(x>1)$, $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a scattering layer 22.

One problem that may be encountered with such scattering layers is that the electrodes may tend to fail open at sharp edges associated with the scattering elements in the layer 22. Although the scattering layer may be planarized, typically such operations do not form a perfectly smooth, defect-free surface. To reduce the possibility of shorts between the first and second electrodes 12 and 16, a short-reduction layer 29 may be employed between the electrodes, as illustrated in FIG. 12. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x(x>1)$, Teflon, and alternating inorganic/polymeric layers are known in the art for encapsulation.

In particular, as illustrated in FIG. 12, very thin layers of transparent encapsulating materials 31 may be deposited on the electrode 12. In this case, the scattering layer 22 may be deposited over the layers of encapsulating materials 31. This structure has the advantage of protecting the electrode 12 during the deposition of the scattering layer 22. Preferably, the layers of transparent encapsulating material 31 has a refractive index comparable to the first refractive index range of the transparent electrode and organic layers, or is very thin (e.g., less than about 0.2 micron) so that wave guided light in the transparent electrode and organic layers will pass through the layers of transparent encapsulating material 31 and be scattered by the scattering layer 22.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5, 6 light rays
10 substrate
12 transparent electrode
13 transparent electrode layer
14 organic layer(s)
15 reflective electrode layer
16 reflective electrode
18 transparent low-index element
19 gap
20 encapsulating cover
21 anti-reflection layer
22 scattering layer
24 scattering particles
24 raised area
25 scattering reflective electrode surface
27 scattering refractive electrode surface
29 short reduction layer
30, 32, 34, 36, 38 pixels
31 layer of encapsulating material

The invention claimed is:

1. An organic light-emitting diode (OLED) device, comprising:
   a substrate;
   an OLED comprising a first reflective electrode and a second transparent electrodes and one or more layer(s) of organic light-emitting material formed between the first reflective and second transparent electrodes, the first reflective electrode formed between the substrate and the one or more layer(s) of organic light-emitting material and the second transparent electrode and the layer(s) of organic light-emitting material having a first refractive index range; and
   a separate transparent encapsulating cover having a second refractive index and through which light from the OLED is emitted;
   further comprising a light scattering layer located between the substrate and cover external to the OLED, and a transparent low-index element having a third refractive index lower than each of the first refractive index range and second refractive index and located between the scattering layer and adjacent to and in contact with the transparent cover through which light from the OLED is emitted; and
   further comprising raised areas extending through the OLED and above the surface of the light-emitting area of the OLED and in contact with the cover.

2. The OLED device of claim 1, wherein the scattering layer is located between an electrode and the cover.

3. The OLED device of claim 1, wherein the scattering layer is adjacent to and in contact with an electrode.

4. The OLED device of claim 1, wherein the cover is a transparent cover through which light from the OLED is emitted, and wherein the transparent low-index element is adjacent to and in contact with the cover.

5. The OLED device of claim 4, wherein the transparent low-index element comprises a solid layer, void or gap between the OLED and the cover.

6. The OLED device of claim 5, wherein the transparent low-index element comprises a gap filled with air or an inert gas.

7. The OLED device of claim 4, wherein the OLED comprises a first reflective electrode formed over the substrate, and a transparent second electrode formed over the layer(s) of organic light-emitting material, and the scattering layer is located over the transparent electrode.

8. The OLED device of claim 7, further comprising a protective layer formed between the second transparent electrode and the scattering layer, the protective layer having a refractive index in the first refractive index range.

9. The OLED device of claim 1, wherein the transparent low-index element comprises a solid layer of optically transparent material.

10. The OLED device of claim 1, wherein the transparent low-index element comprises a void or gap filled with an optically transparent gas or liquid material.

11. The OLED device of claim 1, wherein the light scattering layer is an electrode.

12. The OLED) device of claim 1, wherein at least one electrode comprise multiple layers.

13. The OLED) device of claim 12, wherein the electrode comprising multiple layers includes a transparent layer and a reflective layer.

14. The OLED device of claim 13, wherein the light scattering layer is located between the transparent layer and the reflective layer of the multiple layer electrode.

15. The OLED device of claim 13, wherein the light scattering layer is the reflective layer of the multiple layer electrode.

16. The OLED device of claim 1, wherein the transparent layer of the multiple layer electrode is electrically conductive.

17. The OLED device of claim 1, wherein the transparent low-index element is greater than 1 micrometer thick.

18. The OLED device of claim 1, wherein the OLED is an active-matrix device, and the raised areas comprise patterned insulative layer materials.

19. The OLED device of claim 1, wherein the OLED is a display device.

20. The OLED device of claim 1, wherein the scattering layer includes at least one material having a refractive index equal to or greater than the first refractive index range.

21. The OLED device of claim 1, wherein the scattering layer includes a matrix material with a lower index of refraction and a scattering material with a higher index of refraction.

22. The OLED device of claim 1, wherein the scattering layer includes a matrix material with a higher index of refraction and a scattering material with a lower index of refraction.

23. The OLED device of claim 1, wherein the scattering layer includes polymers, electrically conductive polymers, silicon dioxide, silicon nitride, titanium dioxide, or resin.

24. The OLED device of claim 1, wherein the scattering layer is electrically conductive.

25. The OLED device of claim 1, wherein the transparent substrate or cover has an anti-reflection layer applied to one or both sides thereof.

26. An organic light-emitting diode (OLED) device, comprising:
   a substrate;
   an OLED comprising a first reflective electrode and a second transparent electrodes and one or more layer(s) of organic light-emitting material formed between the first reflective and second transparent electrodes, the first reflective electrode formed between the substrate and the one or more layer(s) of organic light emitting material and the second transparent electrode and the layer(s) of organic light-emitting material having a first refractive index range; and
   a separate transparent encapsulating cover having a second refractive index and through which light from the OLED is emitted;
   further comprising a light scattering layer located between the substrate and cover external to the OLED, and a transparent low-index element having a third refractive index lower than each of the first refractive index range and second refractive index and located between the scattering layer and the transparent cover through which light from the OLED is emitted; and
   further comprising a short-reduction layer having a through-thickness resistivity between $10^{-7}$ ohm-cm$^2$ to $10^3$ ohm-cm$^2$ between the first electrodes and the one or more layers of organic light-emitting materials or between the second electrode and the one or more layers of organic light-emitting materials.

\* \* \* \* \*

UNITED STATES PATENT AND TRADEMARK OFFICE
CERTIFICATE OF CORRECTION

PATENT NO. : 7,602,118 B2  Page 1 of 1
APPLICATION NO. : 11/065082
DATED : October 13, 2009
INVENTOR(S) : Cok et al.

It is certified that error appears in the above-identified patent and that said Letters Patent is hereby corrected as shown below:

| Issued Patent | | Description of Error |
|---|---|---|
| Column | Line | |
| 13 | 9 | In Claim 12, delete "OLED)" and insert -- OLED --, therefor. |
| 13 | 11 | In Claim 13, delete "OLED)" and insert -- OLED --, therefor. |
| 13 | 20 | In Claim 16, delete "claim 1," and insert -- claim 13, --, therefor. |
| 14 | 17 | In Claim 26, delete "light emitting" and insert -- light-emitting --, therefor. |

Signed and Sealed this

Twenty-sixth Day of January, 2010

David J. Kappos
*Director of the United States Patent and Trademark Office*